United States Patent [19]

Freve

[11] Patent Number: 5,426,372
[45] Date of Patent: Jun. 20, 1995

[54] PROBE FOR CAPACITIVE OPEN-CIRCUIT TESTS

[75] Inventor: Paul R. Freve, Hudson, Mass.

[73] Assignee: GenRad, Inc., Concord, Mass.

[21] Appl. No.: 100,090

[22] Filed: Jul. 30, 1993

[51] Int. Cl.6 .................. G01R 31/02; H01H 31/04
[52] U.S. Cl. ........................... 324/538; 324/537; 324/671
[58] Field of Search ............ 324/158 F, 537, 538, 324/671, 158.1

[56] References Cited

U.S. PATENT DOCUMENTS

| | | | |
|---|---|---|---|
| 4,321,533 | 3/1982 | Matrone | 324/158 F |
| 4,340,858 | 7/1982 | Malloy | 324/158 P |
| 4,422,035 | 12/1983 | Risko | 324/671 |
| 4,574,236 | 3/1986 | Hechtman | 324/158 F |
| 4,746,861 | 5/1988 | Nesbitt | 324/158 F |
| 4,799,007 | 1/1989 | Cook et al. | 324/158 F |
| 4,801,866 | 1/1989 | Wixley | 324/158 F |
| 4,837,507 | 6/1989 | Hechtman | 324/158 P |
| 4,996,658 | 2/1991 | Baker | 324/671 |
| 5,124,660 | 6/1992 | Cilingiroglu | 324/538 |
| 5,166,602 | 11/1992 | Byford et al. | 324/158 P |
| 5,187,020 | 2/1993 | Kwon et al. | 324/158 P |
| 5,196,789 | 3/1993 | Golden et al. | 324/158 P |
| 5,254,953 | 10/1993 | Crook et al. | 324/538 |
| 5,264,787 | 11/1993 | Woith et al. | 324/158 P |
| 5,274,336 | 12/1993 | Crook et al. | 324/158 P |

FOREIGN PATENT DOCUMENTS 2143954 2/1985 United Kingdom .
2214362 8/1989 United Kingdom .

OTHER PUBLICATIONS

Balme et al., "New Testing Equipment for SMT PC Boards," *IEEE*, 1988.
Tremblay, Gerard; Meyrueix, Paul, "Optical Reading of Voltages on Printed Circuit Boards," *Microelectronic Engineering*, 1987.
"New Technique Reduces Test Development Time for SMT Open," *Evaluation Engineering*, Feb. 1993.

*Primary Examiner*—Ernest F. Karlsen
*Attorney, Agent, or Firm*—Cesari and McKenna

[57] ABSTRACT

In a capacitive-probe assembly used in an automatic circuit tester (10) to sense varying electric fields that result adjacent to integrated-circuit packages (32) during tests of circuit boards (16), a spacer comprising resilient cellular material has a double-sided printed-board attached to it that provides the probe plate (52) to which the device signals are capacitively coupled. The spacer (44) is in turn mounted on a chip-probe mounting surface (30) provided by the tester's fixture (14). The result is a robust fixture assembly that is easy to manufacture.

10 Claims, 3 Drawing Sheets

PROBE FOR CAPACITIVE OPEN-CIRCUIT TESTS

BACKGROUND OF THE INVENTION

The present invention is directed to automatic electronic-circuit testing and in particular to capacitive testing for open circuits.

The first step in testing electronic circuits that comprise a plurality of integrated circuits mounted on a printed-circuit board is to determine whether the board properly interconnects the integrated circuits mounted on it. In the typical case, it is only after this low-level test is complete that the more-complicated testing of the integrated-circuit and board functions can be performed.

Traditionally, the prevalent type of interconnection failure was a path-to-path short circuit caused by the soldering process between conductive paths on the printed-circuit board. As surface-mounted devices have become more popular, however, the incidence of open circuits, typically between device pins and the paths to which they are to be connected, has increased dramatically. Accordingly, whereas testing for open circuits had not previously been considered worth the effort in many cases, the ability to perform such tests has now become more important.

One type of open-circuit test, which lends itself particularly to performance by lower-cost test equipment, is the capacitive test. In this test, an AC signal is imposed on a printed-circuit path to which a device pin should be connected, and a capacitive probe placed against the device package picks up the resulting alternating electric field if the device pin is properly connected to the printed-circuit-board path. This approach can be quite effective, even in testing of surface-mount devices, whose pins typically are not readily accessible.

Although this approach does lend itself to testing of surface-mount and other types of board devices, its application presents certain difficulties. In the first place, the fixturing tends to be complex, since the capacitive probe is usually placed on the side of the circuit board under test opposite that on which the conventional, conductive probes are located. Therefore, a second fixture plate, disposed on the opposite side, must be provided.

Additionally, the capacitive signal coupling is typically low in capacitance and thus high in impedance, and steps must accordingly be taken to reduce to as great an extent as possible the resultant susceptibility to noise. For this reason, the area of a plate of the capacitive probe should be comparable in size to that of the device package's upper surface so as to maximize capacitance. The typical disposition of such large-area devices at the ends of "pogo"-type spring-loaded plungers results in a structure that not only tends to be relatively susceptible to damage but also requires a level of fixture-manufacturing sophistication that limits the tester owner's choice of fixture houses. These problems are further complicated by the fact that, in order to minimize the noise that corrupts the signal, a buffer amplifier is typically mounted right on each probe plate, at the end of the pogo probe, to buffer the signal before it has suffered much noise corruption.

SUMMARY OF THE INVENTION

I have recognized that a number of these difficulties can be significantly reduced if, according to my invention, the mechanical mounting of the capacitive probe plate to a fixture mounting surface includes a spacer that comprises resilient cellular material. Use of such a spacer in place of a pogo-type plunger permits the capacitive-probe mounting to be considerably simpler so that its fabrication is within the capabilities of a relatively large number of fixture manufacturers of varying degrees of sophistication. Because such a spacer typically permits resilient deformation in more than one direction, it is not nearly as susceptible to the damage resulting from sideways strain that the more-conventional pogo-type plungers are likely to suffer. Moreover, since the signal picked up by the probe does not have to be conducted through a pogo-type plunger, it is more readily provided with a signal path of relatively low common-mode noise susceptibility, such as twisted-pair or coaxial-cable path. This eliminates the need to place a buffer amplifier right on the capacitive probe. Moreover, capacitance repeatability with such a probe mounting tends to be superior to that which results from conventional approaches, since a spacer of resilient cellular material permits the probe to adapt to deviations from mechanical parallelism between chip-package upper surfaces and the fixture probe-mounting surface.

BRIEF DESCRIPTION OF THE DRAWINGS

These and further features and advantages of the present invention are described below in connection with the accompanying drawings, in which.

DETAILED DESCRIPTION OF AN ILLUSTRATIVE EMBODIMENT

Figure 1:
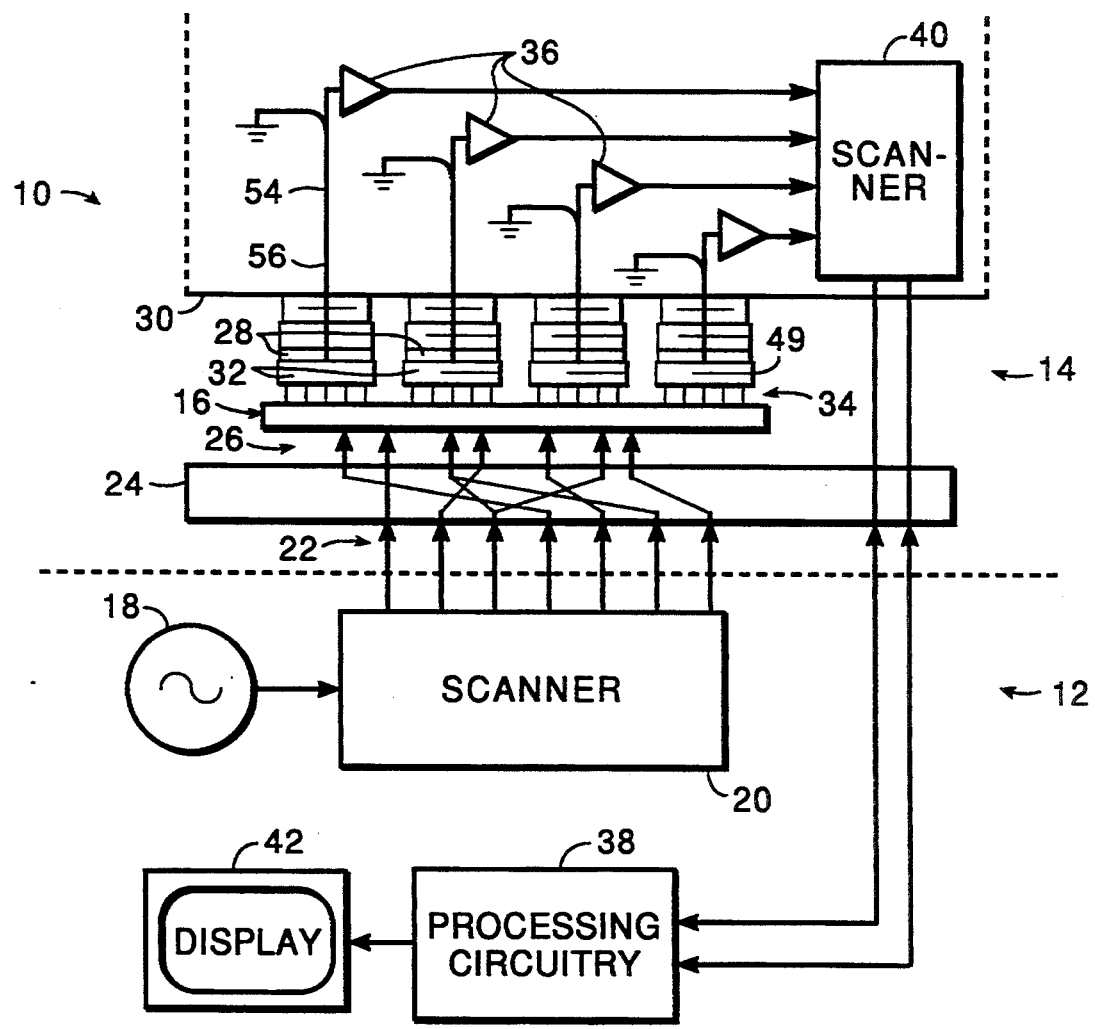
FIG. 1 is a schematic representation of an automatic circuit tester in which the teachings of the present invention have been employed.

FIG. 1 depicts an automatic circuit tester 10 that includes standard system hardware 12 as well as a custom fixture 14 prepared for a particular kind of board 16 to be tested. A signal source 18 generates one or more AC signals that a scanner 20 distributes to system pins 22. The pins 22 contact corresponding locations on the bottom surface of a lower fixture plate 24 that routes the resultant signals to circuit-under-test-contacting probes 26 appropriately positioned to contact test nodes on the bottom surface of the board 16.

Capacitive probes 28 are mounted on a chip-probe mounting surface 30 of a fixture plate typically, although not necessarily, disposed on the side of the board under test 16 opposite that on which the fixture plate 24 containing the conductive-coupling probes is. The capacitive probes 28 contact integrated-circuit packages 32 mounted on the board 16. If the device pins 34 on the integrated-circuit packages 32 are properly connected to signal paths on the board 26, the signals applied by the conductive fixture probes 26 to those paths will be capacitively coupled to the capacitive probes 28.

Probes 28 forward those signals to buffer amplifiers 36 mounted on the upper fixture plate, and these buffers transmit the resultant buffered signals to processing circuitry 38 in the tester, possibly by way of a scanner 40 mounted on the fixture to select among those buffered signals for transmission to the system hardware 12. The processing circuitry 38 determines whether the resultant signals meet predetermined criteria—typically, whether those signals' magnitudes exceed predetermined minima—and send a continuity indication to a display 42 or some other destination as a result. Although the illustrated embodiment applies signals by way of conductive probes 26 and senses them by way of capacitive probes 28, it will be apparent to those skilled in the art that capacitive driving and conductive sensing—and, indeed, capacitive driving and sensing—can be employed by other embodiments of the present invention.

Figure 2:
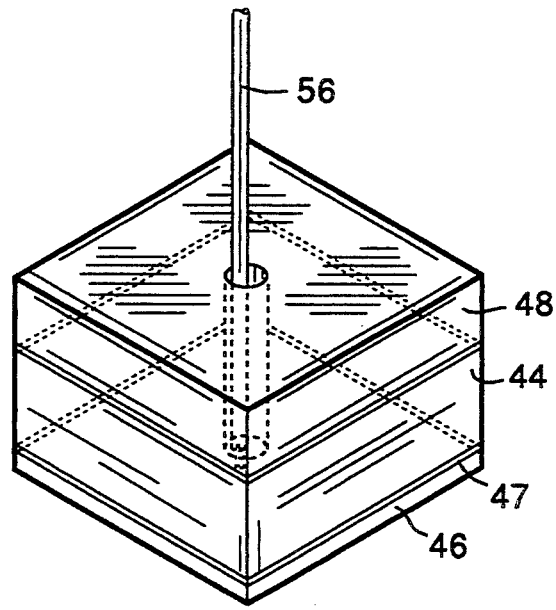
FIG. 2 is an isometric view of the capacitive-probe assembly employed by the present invention.

According to the present invention, the probe is so mounted that the resultant fixture is robust and simple to manufacture. This mounting approach, depicted in more detail in FIG. 2, employs a spacer 44 that comprises resilient cellular material, such as PORON cellular polyurethane produced by the Rogers Corporation of East Woodstock, Conn. The capacitive probe 46 is secured by an adhesive layer 47 to the spacer's bottom surface. Typically, the adhesive 47 used to secure the probe plate 46 to the spacer 44 is of the conductive variety so as to enable any static charge that might otherwise build up in the spacer to be drawn away by a ground connection to be described below. The other side of the spacer could similarly be attached directly to the fixture's chip-probe mounting surface 30, but it will typically be preferable to secure it by adhesive instead to a small, typically rigid carrier block 48, since it will usually be more convenient to employ, say, screws to attach the assembly to the upper fixture plate, and the rigid carrier block 48 is better suited to this purpose. Since they have internal voids, many resilient cellular materials "give" readily in all directions and can be strained considerably in all directions without damage, the probe assembly is quite robust. Furthermore, it permits the angle of the probe plate to adjust to that of the integrated-circuit package so that, as is suggested by package 49 in FIG. 1, the space between the probe plate and the integrated-circuit package is minimized. This maximizes the resultant capacitance and minimizes the resultant impedance. Such a capability is not as easily afforded with conventional pogo-type mounting.

Figure 3:
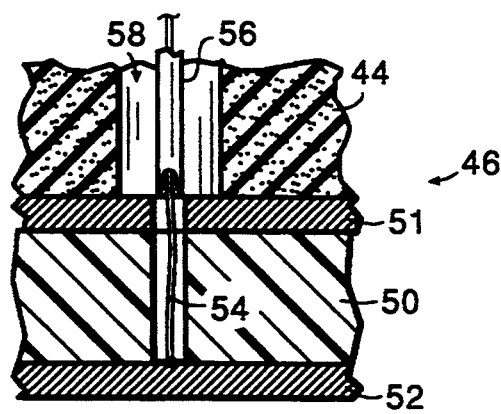
FIG. 3 is a detailed cross-sectional view of the capacitive probe showing its upper and lower plates.

FIG. 3 depicts the capacitive probe 46 in cross section and shows that in the illustrated embodiment it takes the form of a double-sided printed-circuit board, including a synthetic-resin dielectric layer 50 that has conductive layers 51 and 52 on its upper and lower faces, respectively. The lower layer serves as a probe plate, and capacitance exists between the plate 52 and the device pins 34 together with conductors to which they are connected inside the integrated-circuit packages 32. This capacitance couples the signals imposed on pins 34 to the probe plate 52, and the resultant signal is conducted to an input terminal of one of the buffer amplifiers 36 by one conductor 54 of a twisted-pair or, as depicted in the drawing, coaxial cable 56.

The other, outer conductor of cable 56 connects fixture, ground to layer 51, which thereby serves as a ground plane, shielding the lower conductive layer 52 from noise. One way of looking at this is that the upper layer 50 increases the capacitive coupling between the probe plate 52 and ground so that a capacitive voltage divider is formed whose output impedance—and thus its noise susceptibility—is significantly lower than it would be in the absence of the upper conductive layer 51. The outer conductor of the cable 56 similarly shields the inner conductor 54 from noise until it reaches a high-input-impedance buffer amplifier 36 that generates an amplified replica of that signal with low output impedance so as to reduce the vulnerability of the transmitted signal to noise corruption.

The ability to provide this type of shielding makes it more feasible to avoid locating the buffer amplifiers 36 right on the capacitive probes, and this, of course, greatly reduces the susceptibility of the fixture to damage during handling. It also reduces manufacturing difficulty and the seriousness of any damage that does occur. The use of the resilient spacer 44 facilitates this type of shielding, since the signal path can be provided by a simple flexible cable trained through a central aperture 58 in the spacer 44 and thereby protected by the spacer. Clearly, provision of such shielded signal transmission is more complicated when pogo-type or similar mounting techniques are employed.

Figure 4:
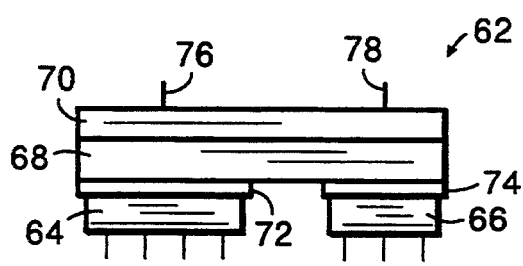
FIG. 4 depicts a single probe assembly that contacts two integrated-circuit packages simultaneously.
Figure 6:
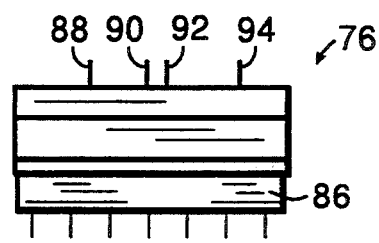
FIG. 6 is an elevational view of a single probe assembly contacting a single integrated-circuit package.

Typically, a separate assembly of the type depicted in FIG. 3 will be provided for each of the board devices whose connections to the board are to be tested. This arrangement is not necessary, however, as FIGS. 4–7 illustrate. FIG. 4 depicts a single probe assembly 62 that contacts two separate board devices 64 and 66. In such an arrangement, a single probe plate such as layer 52 of FIG. 3 could be employed, typically with a single ground plane, such as layer 51 of FIG. 3, and a single conductor pair.

Figure 5:
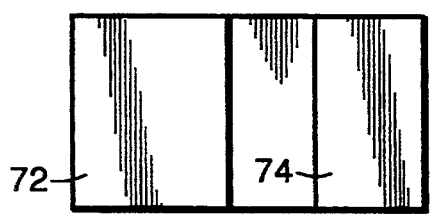
FIG. 5 is a bottom view of the probe plate of the assembly of FIG. 4.
Figure 7:
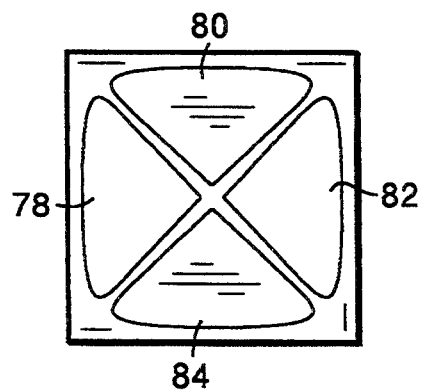
FIG. 7 is a bottom view of the probe plate of FIG. 6.

The arrangement of FIGS. 4 and 5 uses a single ground plane, but the bottom conductive layer is divided into two separate probe plates 72 and 74, as FIG. 5 illustrates, and separate cables 76 and 78 lead to the two separate probe plates. These probe plates separately register with the two separate board devices 64 and 66 so that signals can be obtained from them simultaneously. As is best appreciated by reference to commonly assigned copending U.S. patent application of Khazam et al. for Simultaneous Capacitive Open-Circuit Testing, filed on even date herewith and hereby incorporated by reference, a single-probe-plate assembly could be used instead to receive signals simultaneously from the two board devices 64 and 66, and distinctions can be made between them if the paths to which the device pins of the two different devices should be connected are driven with different-frequency signals.

Conversely, there may be some board devices for which it is possible to distinguish spatially among the signals obtained from different device pins on the same device, and multiple probe plates may accordingly be used for a single board device. For instance, the probe assembly 76 of FIG. 6 may have the bottom, probe-plate-providing conductive layer divided into four probe plates 78, 80, 82, and 84, all of which are brought into proximity with the same board device 86 but in different regions thereof. If the structure of the board device 86 is such that signals on certain (properly connected) device pins are coupled relatively strongly to one or two of the probe plates 78, 80, 82, and 84 but not to others, then the device-pin sources of simultaneous capacitively received signals can be distinguished in accordance with the separate cables 88, 90, 92, and 94 on which they appear.

It is thus apparent that the invention can be practiced in a wide range of embodiments and constitutes a significant advance in the art.

I claim:

1. For testing, on a circuit board on which is mounted a circuit package that houses an integrated circuit and provides an IC pin intended to be conductively connected to a conductive path associated therewith on the circuit board, the continuity between the IC pin and the conductive board path associated therewith, an automatic circuit tester comprising:
   A) drive circuitry for generating test signals;
   B) a fixture for securing the circuit board, providing a chip-probe mounting surface, and affording electrical communication between the drive circuitry and the board path for application of the test signals to the board path when the circuit board is secured by the fixture, the fixture further including:
      i) a spacer comprising resilient cellular material, one side of the spacer being mounted on the chip-probe mounting surface for support thereby; and
      ii) a conductive probe plate mounted on an opposite side of the spacer for support thereby in the vicinity of the circuit package, capacitive coupling to the probe plate of signals occurring in the circuit package as a result of the test signals applied, and movement of the probe plate with respect to the chip-probe mounting surface by resilient deformation of the spacer; and
   C) continuity-indicating circuitry responsive to the signal coupled to the probe plate for determining whether the coupled signal meets a predetermined criterion and, if it does not, generating an indication of a lack of continuity between the board path and the IC pin.

2. A tester as defined in claim 1 wherein the fixture further includes a mounting block by which the spacer is mounted to the probe, mounting surface.

3. A tester as defined in claim 1 wherein the resilient cellular material is cellular polyurethane.

4. A tester as defined in claim 1 wherein the continuity-intricating circuitry determines whether the magnitude of the coupled signal exceeds a predetermined minimum.

5. A tester as defined in claim 1 wherein the fixture includes a dielectric board on one surface of which the probe plate is provided as a conductive layer.

6. A tester as defined in claim 1 wherein:
   A) the fixture includes a fixture plate that provides the chip-probe mounting surface; and
   B) the continuity-indicating circuitry includes:
      i) a buffer amplifier mounted on the fixture plate and including an input terminal; and
      ii) a flexible cable comprising a conductor that connects the probe plate to the input terminal of the buffer amplifier.

7. A tester as defined in claim 6 wherein the flexible cable includes a second conductor maintained at a fixed, ground potential.

8. A tester as defined in claim 7 wherein the fixture includes a dielectric board on one surface of which the probe plate is provided as a first conductive layer and on the other surface of which a ground plane connected to the second conductor is provided as a second conductive layer.

9. A tester as defined in claim 8 wherein the spacer forms an aperture through which the cable runs.

10. For testing, on a circuit board on which is mounted a circuit package that houses an integrated circuit and provides an IC pin intended to be conductively connected to a conductive path associated therewith on the circuit board, the continuity between the IC pin and the conductive board path associated therewith, an automatic circuit tester comprising:
   A) a fixture for securing the circuit board, providing a chip-probe mounting surface, and contacting the board path to conduct therefrom the signal occurring on the board path when the circuit board is secured by the fixture, the fixture further including:
      i) a spacer comprising resilient cellular material, one side of the spacer being mounted on the chip-probe, mounting surface for support thereby; and
      ii) a conductive probe plate mounted on an opposite side of the spacer for support thereby in the vicinity of the circuit package, capacitive coupling to the IC pin of signals occurring on the probe plate, and movement of the probe plate with respect to the chip-probe mounting surface by resilient deformation of the spacer;
   B) drive circuitry for applying test signals to the probe plate; and
   C) continuity-indicating circuitry responsive to the signal conducted from the path by the fixture for determining whether the sensed signal meets a predetermined criterion and, if it does not, generating an indication of a lack of continuity between the board path and the IC pin.

* * * * *